United States Patent
Feygin et al.

(10) Patent No.: US 9,130,575 B2
(45) Date of Patent: Sep. 8, 2015

(54) COMMUNICATION SYSTEM WITH CHARGE PUMP MECHANISM AND METHOD OF OPERATION THEREOF

(71) Applicant: Samsung Electronics Co., Ltd., Gyeonggi-Do (KR)

(72) Inventors: Gennady Feygin, San Diego, CA (US); Inyup Kang, San Diego, CA (US)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 0 days.

(21) Appl. No.: 14/148,490

(22) Filed: Jan. 6, 2014

(65) Prior Publication Data

US 2014/0270025 A1 Sep. 18, 2014

Related U.S. Application Data (60) Provisional application No. 61/782,333, filed on Mar. 14, 2013.

(51) Int. Cl.
*H03D 3/24* (2006.01)
*H03L 7/00* (2006.01)
*H03L 7/089* (2006.01)

(52) U.S. Cl.
CPC ............ *H03L 7/00* (2013.01); *H03L 7/0891* (2013.01)

(58) Field of Classification Search
CPC .................................................. H04L 7/0012

USPC ...................................... 375/374, 355
See application file for complete search history.

(56) References Cited

U.S. PATENT DOCUMENTS

| 3,805,183 | A  | * | 4/1974  | Lance ........................ 331/18 |
| 6,407,619 | B1 |   | 6/2002  | Tanaka |
| 6,516,187 | B1 | * | 2/2003  | Williams et al. ............ 455/313 |
| 6,778,011 | B2 | * | 8/2004  | Noro et al. ................... 330/10 |
| 8,248,104 | B2 |   | 8/2012  | Maeda |
| 8,330,511 | B2 |   | 12/2012 | Raghunathan et al. |
| 2007/0126514 | A1 | * | 6/2007 | Lin et al. ..................... 331/16 |
| 2010/0171527 | A1 | * | 7/2010 | Maeda ............................ 327/7 |
| 2010/0320992 | A1 | * | 12/2010 | Dearn ......................... 323/311 |
| 2011/0254720 | A1 | * | 10/2011 | Marques ..................... 341/144 |
| 2012/0280744 | A1 |   | 11/2012 | Hsieh |

FOREIGN PATENT DOCUMENTS

| EP | 496553 | 1/1991 |
| EP | 1805893 | 10/2004 |
| WO | WO 2006087508 A1 * | 8/2006 |

* cited by examiner

*Primary Examiner* — Juan A Torres
(74) *Attorney, Agent, or Firm* — IP Investment Law Group (57) ABSTRACT

A method of operation of a wireless communication system includes: synthesizing an incoming clock reference by differentiating an even cycle signal and an odd cycle signal; commutating a pair of resistors (R1, R2) based on the even cycle signal and the odd cycle signal; and controlling an amplifier output by the pair of the resistors (R1, R2) for the purpose of mitigating the effects of mismatch of the pair of resistors.

19 Claims, 6 Drawing Sheets

COMMUNICATION SYSTEM WITH CHARGE PUMP MECHANISM AND METHOD OF OPERATION THEREOF

CROSS-REFERENCE TO RELATED APPLICATION(S)

This application claims the benefit of U.S. Provisional Patent Application Ser. No. 61/782,333 filed Mar. 14, 2013, and the subject matter thereof is incorporated herein by reference thereto.

TECHNICAL FIELD

An embodiment of the present invention relates generally to a communication system, and more particularly to a system for image conversion.

BACKGROUND

In every consumer device, such as cellular telephones, global positioning devices, two way radios, wireline, TV tuners, disk drives, fiber-optics, and the like, synthesis of a carrier frequency is an essential operation of the transceiver, and many other communication functions. Frequency synthesizers in all high performance cellular transceivers employ Phase-Locked Loop (PLL) as the circuit solution to the challenge of producing a carrier frequency with low noise and high frequency accuracy.

A circuit known as Charge Pump is employed in the majority of PLL synthesizers. Charge pump circuits contain two branches, known as Up and DOWN branches. The currents of two branches are integrated on a capacitor, and the resultant capacitor voltage, with some additional filtering, serves as a control voltage for the Voltage Controlled Oscillator (VCO). Optimal operation occurs when the up and the down currents are equal to each other, but practical circuits will frequently suffer from mismatch between the up and the down circuit. The mismatch can produce a number of undesirable phenomena, including an increase in the reference spurious tone. The imbalance between the up and the down circuits also causes phase-to-voltage transfer function of the Charge-Pump-Phase frequency detector to become nonlinear.

This is undesirable, especially in the case of fractional-N PLLs. The fractional divided of fractional-N PLL produces shaped quantization noise, with peak values of noise occurring near ½ reference frequency. Even-order components of Charge-pump nonlinearity cause substantial component of the noise near ½ reference frequency to be partially down-converted down to the low frequencies near DC. This is known in the industry as noise folding of components near ½ reference frequency. While noise components located near ½ reference frequency are substantially attenuated by the Low pass filter integrated into the charge pump, components downconverted to the low frequencies are unaffected by the low-pass filter and cause deterioration in PLL's noise performance.

Thus, a need still remains for a communication system with charge pump mechanism for synthesis of a carrier frequency. In view of the ever-increasing commercial competitive pressures, along with growing consumer expectations and the diminishing opportunities for meaningful product differentiation in the marketplace, it is increasingly critical that answers be found to these problems. Additionally, the need to reduce costs, improve efficiencies and performance, and meet competitive pressures adds an even greater urgency to the critical necessity for finding answers to these problems.

Solutions to these problems have been long sought but prior developments have not taught or suggested any solutions and, thus, solutions to these problems have long eluded those skilled in the art.

SUMMARY

An embodiment of the present invention provides a communication system, including: a cycle control clocked by an incoming clock reference for differentiating an even cycle and an odd cycle; an R1 resistor commutated based on the even cycle and the odd cycle from the cycle control; and an amplifier output controlled by the R1 resistor for matching the incoming clock reference.

An embodiment of the present invention provides a method of operation of a communication system including: synthesizing an incoming clock reference by differentiating an even cycle and an odd cycle; commutating an R1 resistor based on the even cycle and the odd cycle; and controlling an amplifier output by the R1 resistor for matching the incoming clock reference.

An embodiment of the present invention provides a method of operation of a communication system including: synthesizing an incoming clock reference by differentiating an even cycle and an odd cycle; commutating an R1 resistor and an R2 resistor based on the even cycle and the odd cycle; controlling an amplifier output by the R1 resistor and the R2 resistor; and generating a feedback clock, based on the amplifier output, for matching the incoming clock reference.

Certain embodiments of the invention have other steps or elements in addition to or in place of those mentioned above. The steps or elements will become apparent to those skilled in the art from a reading of the following detailed description when taken with reference to the accompanying drawings.

DETAILED DESCRIPTION

An embodiment of the present invention provides a system with improved linearity that employs a charge pump based on resistors-with-switches, instead of active current sources, such as charge-up mode and charge-down mode of the charge pump. Equal-value charge pump resistors of value R are used in both the charge-up mode and the charge-down mode of the charge pump, and the currents are integrated using an active amplifier-based Low-Pass Filter. Employing the active amplifier-based Low-Pass Filter creates a "virtual Ground condition" at the inputs of the amplifier, which implies that the voltage at both the bias input and the detected input terminals of the amplifier are equal to $V_{DD}/2$ and also equal to each other. The current in the charge-up mode becomes equal to $(V_{DD}-V_{DD}/2)/R$ and the current in charge-down mode is equal to $(V_{DD}/2-0)/R$, where R is the value of the charge pump resistor.

A single-ended variant of the charge pump employs two-switches for each resistor. Based on this embodiment, each of the resistor R will alternate between being part of the charge-up mode and the charge-down mode, by commutating controls of the resistors with period equal to 2 reference clock cycles.

By way of an example, the two resistors can have actual values R1 and R2 that have some difference, with the commutation of the resistors both the charge-up mode and the charge-down mode will experience average current of ½ $V_{DD}/(R1/2+R2/2)$. The difference (R1−R2) will be up-converted to ½ the reference frequency, where it will be severely attenuated by the low-pass filter. Alternative commutation schemes may be chosen, for example by pseudo-random selection of two commutating resistors will spread any mismatch in the resistor values evenly across spectrum from DC to the reference frequency.

The following embodiments are described in sufficient detail to enable those skilled in the art to make and use the invention. It is to be understood that other embodiments would be evident based on the present disclosure, and that system, process, or mechanical changes may be made without departing from the scope of an embodiment of the present invention.

In the following description, numerous specific details are given to provide a thorough understanding of the invention. However, it will be apparent that the invention may be practiced without these specific details. In order to avoid obscuring an embodiment of the present invention, some well-known circuits, system configurations, and process steps are not disclosed in detail.

The drawings showing embodiments of the system are semi-diagrammatic, and not to scale and, particularly, some of the dimensions are for the clarity of presentation and are shown exaggerated in the drawing figures. Similarly, although the views in the drawings for ease of description generally show similar orientations, this depiction in the figures is arbitrary for the most part. Generally, the invention can be operated in any orientation. The embodiments have been numbered first embodiment, second embodiment, etc. as a matter of descriptive convenience and are not intended to have any other significance or provide limitations for an embodiment of the present invention.

The term "commutating" referred to herein means systematically switching between a positive supply and a negative supply without requiring movement of a device. The term "switch" referred to herein can include a device that transforms from a low impedance to a high impedance and vice versa based on a control being asserted or negated. The term "mismatch" referred to herein means a variation in component value caused by manufacturing tolerance.

The term "module" referred to herein can include software, hardware, or a combination thereof in an embodiment of the present invention in accordance with the context in which the term is used. For example, the software can be machine code, firmware, embedded code, and application software. Also for example, the hardware can be circuitry, processor, computer, integrated circuit, integrated circuit cores, a pressure sensor, an inertial sensor, a microelectromechanical system (MEMS), passive devices, or a combination thereof.

Figure 1:
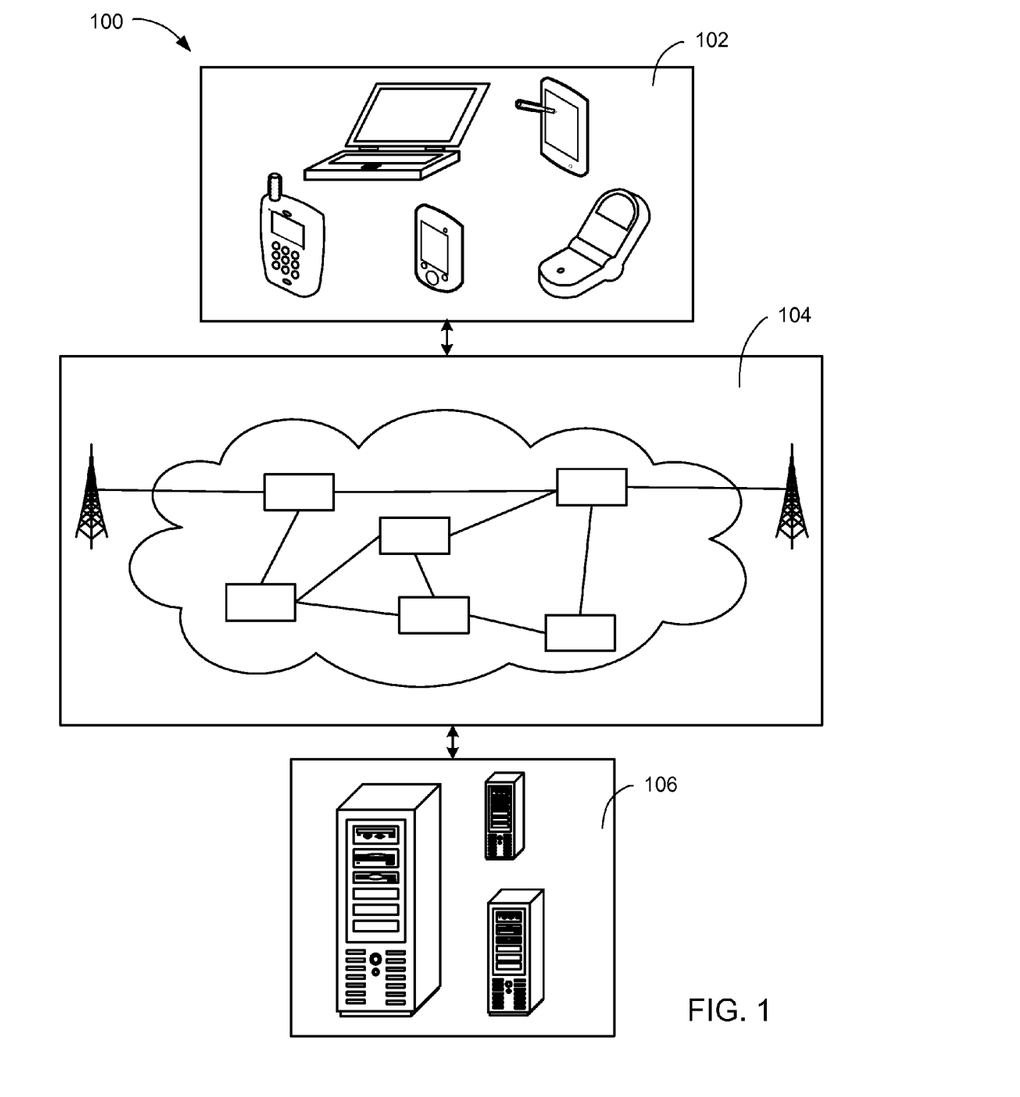
FIG. 1 is a communication system with charge pump mechanism in an embodiment of the present invention.

Referring now to FIG. 1, therein is shown a communication system 100 with image conversion mechanism in an embodiment of the present invention. The communication system 100 includes a communication device 102, such as a client or a server, connected to a wired device 106, such as a client or server. The communication device 102 can communicate with the wired device 106 through a communication path 104, such as a wireless or wired network.

For example, the communication device 102 can be of any of a variety of devices, such as a cellular phone, personal digital assistant, a notebook computer, a router, repeater, optical device, or other multi-functional display or entertainment device. The communication device 102 can couple, either directly or indirectly, to the communication path 104 to communicate with the wired device 106 or can be a stand-alone device.

For illustrative purposes, the communication system 100 is described with the communication device 102 as a personal communication device, although it is understood that the communication device 102 can be different types of devices. As an example, the communication device 102 can be a personal digital assistant, a cellular phone, a router, repeater, optical device, a disk drive or a multi-media set.

The wired device 106 can be any of a variety of centralized or decentralized computing devices. For example, the wired device 106 can be a multimedia computer, a laptop computer, a desktop computer, grid-computing resources, a virtualized computer resource, cloud computing resource, peer-to-peer distributed computing devices, or a combination thereof.

The wired device 106 can be centralized in a single room, distributed across different rooms, distributed across different geographical locations, embedded within a telecommunications network. The wired device 106 can couple with the communication path 104 to connect with the communication device 102.

For illustrative purposes, the communication system 100 is described with the wired device 106 as a computing device, although it is understood that the wired device 106 can be different types of devices. Also for illustrative purposes, the communication system 100 is shown with the wired device 106 and the communication device 102 as end points of the communication path 104, although it is understood that the communication system 100 can have a different partition between the communication device 102, the wired device 106, and the communication path 104. For example, the communication device 102, the wired device 106, or a combination thereof can also function as part of the communication path 104.

The communication path 104 can span and represent a variety of networks. For example, the communication path 104 can include wireless communication, wired communication, optical, ultrasonic, or the combination thereof. Satellite communication, cellular communication, Bluetooth, Infrared Data Association standard (IrDA), wireless fidelity (WiFi), and worldwide interoperability for microwave access (WiMAX) are examples of communication that can be included in the communication path 104. Ethernet, digital subscriber line (DSL), fiber to the home (FTTH), and plain old telephone service (POTS) are examples of wired communication that can be included in the communication path 104. Further, the communication path 104 can traverse a number of network topologies and distances. For example, the communication path 104 can include direct connection, personal area network (PAN), local area network (LAN), metropolitan area network (MAN), wide area network (WAN), or a combination thereof.

Figure 2:
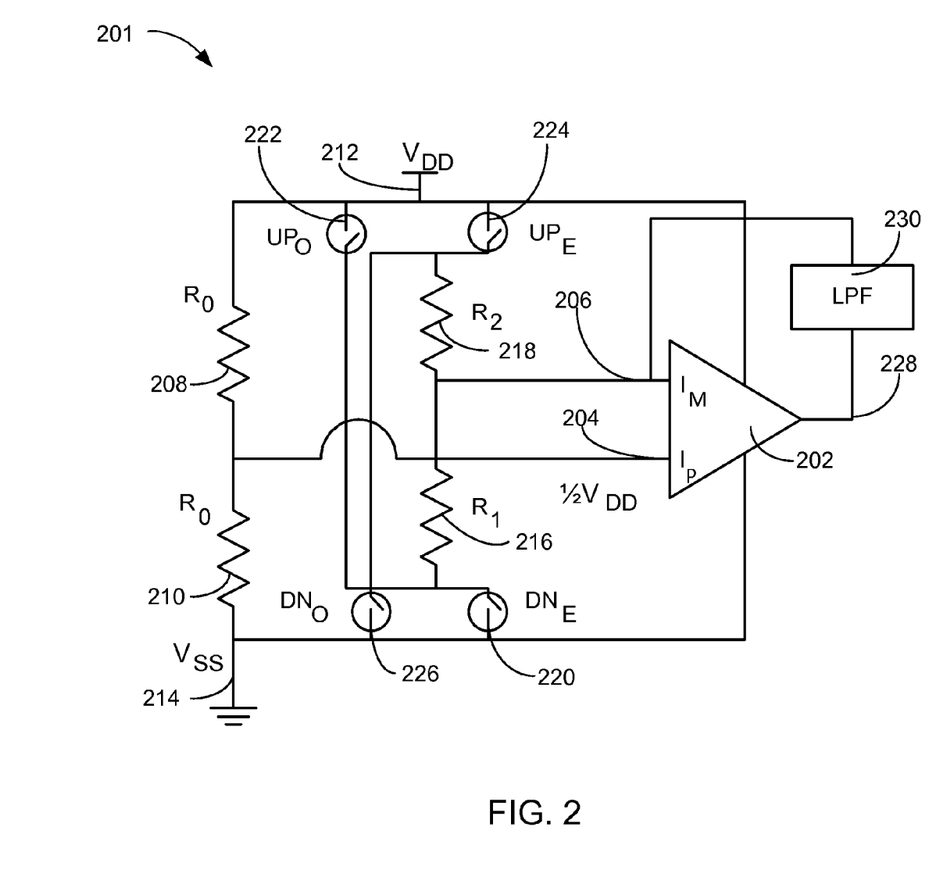
FIG. 2 is a schematic diagram of a charge pump of the communication system of FIG. 1.

Referring now to FIG. 2, therein is shown a schematic diagram of a charge pump 201 of the communication system 100 of FIG. 1. The schematic diagram of the charge pump 201 includes an amplifier 202, such as an operational amplifier, having a bias input 204 and a detected input 206.

The bias input 204 can be coupled to a voltage divider formed by a first R0 resistor 208 and a second R0 resistor 210. The first R0 resistor 208 and the second R0 resistor 210 are of equal value and are joined together at one end. The opposite end of the first R0 resistor can be coupled to a positive supply 212, such as a $V_{DD}$ voltage. The opposite end of the second R0 resistor can be coupled to a negative supply 214, such as a $V_{SS}$ voltage. The resultant voltage divider can provide a ½ $V_{DD}$ bias voltage at the bias input 204 for providing a reference for the detected input 206. Other well-known techniques of producing precision ½ VDD reference may be employed, including for instance switched-capacitor based voltage dividers.

The detected input 206 can be coupled to a junction between an R1 resistor 216 and an R2 resistor 218. The resistance value of the R1 resistor 216 and the R2 resistor 218 are set to be equal, but they can vary significantly due to manufacturing tolerances. The opposite end of the R1 resistor 216 can be coupled to a first switch 220 and a second switch 222. If the first switch 220 is activated, the opposite end of the R1 resistor 216 can be coupled to the negative supply 214. The activation of the switch is performed by asserting a control in order to put the switch in a low impedance state, while negating the control puts the switch in a high impedance state. If the second switch is activated the opposite end of the R1 resistor 216 can be coupled to the positive supply 212. It is understood that the first switch 220 and the second switch 222 are never activated at the same time.

The opposite end of the R2 resistor 218 from the R1 resistor 216 can be coupled to a third switch 224 and a fourth switch 226. If the third switch 224 is activated the opposite end of the R2 resistor 218 can be coupled to the positive supply 212. If the fourth switch 226 is activated the opposite end of the R2 resistor 218 can be coupled to the negative supply 214. It is understood that the third switch 224 and the fourth switch 222 are never activated at the same time.

An amplifier output 228 can respond to the states of the bias input 204 and the detected input 206 in order to create an output voltage that can be used to adjust the frequency synthesis of the communication device 102 of FIG. 1. The amplifier output 228 can be coupled to a low-pass filter 230, such as a single ended low-pass filter, which blocks high frequencies that might be included in the output voltage from the amplifier output 228. The low-pass filter 230 is subsequently coupled back to the detected input 206 in order to stabilize the response of the amplifier output 228.

The first switch 220, the second switch 222, the third switch 224, and the fourth switch 226 can provide a charge-up function or a charge-down function for the amplifier output 228 by commutating the R1 resistor 216 and the R2 resistor 218. The first switch 220 is only activated during an even cycle to charge-down the amplifier output 228 through the R1 resistor 216. The second switch 222 is only activated during an odd cycle to charge-up the amplifier output 228 through the R1 resistor 216. The third switch 224 is only activated during an even cycle to charge-up the amplifier output 228 through the R2 resistor 218. The fourth switch 226 is only activated during an odd cycle to charge-down the amplifier output 228 through the R2 resistor 218.

It has been discovered that differentiating the odd and even cycles of the charge pump 201 and activating a different switch for charging-up and charging-down the amplifier output 228 can produce an average of the up current and the down current that are equal. The error associated with a difference between the charge-up function and the charge-down function can be shifted to a higher frequency, where it can be attenuated by the low-pass filter 230. The charge pump 201 can charge-up the amplifier output 228 through the R2 resistor 218 and the third switch 224 on even cycles and through the R1 resistor 216 and the second switch 222 on the odd cycles. Likewise, the charge pump 201 can charge-down the amplifier output 228 through the R1 resistor 216 and the first switch 220 on the even cycles and through the R2 resistor 218 and the fourth switch 226 on the odd cycles.

Figure 3:
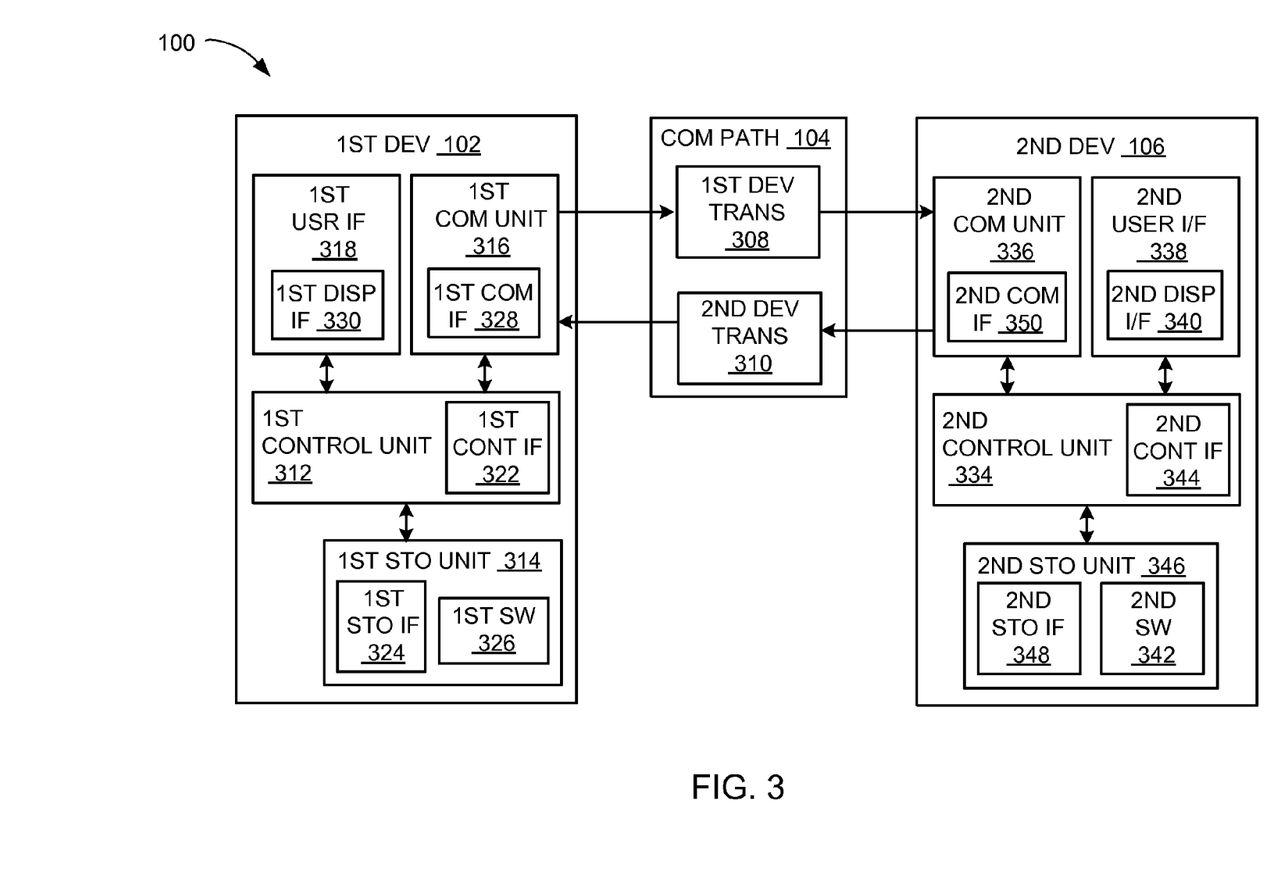
FIG. 3 is an exemplary block diagram of the communication system.

Referring now to FIG. 3, therein is shown an exemplary block diagram of the communication system 100. The communication system 100 can include the communication device 102, the communication path 104, and the wired device 106. The communication device 102 can send information in a first device transmission 308 over the communication path 104 to the wired device 106. The wired device 106 can send information in a second device transmission 310 over the communication path 104 to the communication device 102.

For illustrative purposes, the communication system 100 is shown with the communication device 102 as a client device, although it is understood that the communication system 100 can have the communication device 102 as a different type of device. For example, the communication device 102 can be a server having a display interface.

Also for illustrative purposes, the communication system 100 is shown with the wired device 106 as a server, although it is understood that the communication system 100 can have the wired device 106 as a different type of device. For example, the wired device 106 can be a client device.

For brevity of description in this embodiment of the present invention, the communication device 102 will be described as a client device and the wired device 106 will be described as a server device. The embodiment of the present invention is not limited to this selection for the type of devices. The selection is an example of an embodiment of the present invention.

The communication device 102 can include a first control unit 312, a first storage unit 314, a first communication unit 316, and a first user interface 318. The first control unit 312 can include a first control interface 322. The first control unit 312 can execute a first software 326 to provide the intelligence of the communication system 100.

The first control unit 312 can be implemented in a number of different manners. For example, the first control unit 312 can be a processor, an application specific integrated circuit (ASIC) an embedded processor, a microprocessor, a hardware control logic, a hardware finite state machine (FSM), a digital signal processor (DSP), or a combination thereof. The first control interface 322 can be used for communication between the first control unit 312 and other functional units in the communication device 102. The first control interface 322 can also be used for communication that is external to the communication device 102.

The first control interface 322 can receive information from the other functional units or from external sources, or can transmit information to the other functional units or to external destinations. The external sources and the external destinations refer to sources and destinations external to the communication device 102.

The first control interface 322 can be implemented in different ways and can include different implementations depending on which functional units or external units are being interfaced with the first control interface 322. For example, the first control interface 322 can be implemented with a pressure sensor, an inertial sensor, a microelectromechanical system (MEMS), optical circuitry, waveguides, wireless circuitry, wireline circuitry, or a combination thereof.

The first storage unit 314 can store the first software 326. The first storage unit 314 can also store the relevant information, such as data representing incoming images, data representing previously presented image, sound files, or a combination thereof.

The first storage unit 314 can be a volatile memory, a nonvolatile memory, an internal memory, an external memory, or a combination thereof. For example, the first storage unit 314 can be a nonvolatile storage such as nonvolatile random access memory (NVRAM), Flash memory, disk storage, or a volatile storage such as static random access memory (SRAM).

The first storage unit 314 can include a first storage interface 324. The first storage interface 324 can be used for communication between and other functional units in the communication device 102. The first storage interface 324 can also be used for communication that is external to the communication device 102.

The first storage interface 324 can receive information from the other functional units or from external sources, or can transmit information to the other functional units or to external destinations. The external sources and the external destinations refer to sources and destinations external to the communication device 102.

The first storage interface 324 can include different implementations depending on which functional units or external units are being interfaced with the first storage unit 314. The first storage interface 324 can be implemented with technologies and techniques similar to the implementation of the first control interface 322.

The first communication unit 316 can enable external communication to and from the communication device 102. For example, the first communication unit 316 can permit the communication device 102 to communicate with the wired device 106 of FIG. 1, an attachment, such as a peripheral device or a computer desktop, and the communication path 104.

The first communication unit 316 can also function as a communication hub allowing the communication device 102 to function as part of the communication path 104 and not limited to be an end point or terminal unit to the communication path 104. The first communication unit 316 can include active and passive components, such as microelectronics or an antenna, for interaction with the communication path 104.

The first communication unit 316 can include a frequency synthesis phase-lock loop 328. The frequency synthesis phase-lock loop 328 can be used for communication between the first communication unit 316 and other functional units in the communication device 102. The frequency synthesis phase-lock loop 328 can provide synchronization to receive information from the other functional units or can provide frequency synthesis to transmit information to the other functional units.

The frequency synthesis phase-lock loop 328 can include different implementations depending on which functional units are being interfaced with the first communication unit 316. The frequency synthesis phase-lock loop 328 can be implemented with technologies and techniques similar to the implementation of the first control interface 322.

The first user interface 318 allows a user (not shown) to interface and interact with the communication device 102. The first user interface 318 can include an input device and an output device. Examples of the input device of the first user interface 318 can include a keypad, a touchpad, soft-keys, a keyboard, a microphone, an infrared sensor for receiving remote signals, or any combination thereof to provide data and communication inputs.

The first user interface 318 can include a first display interface 330. The first display interface 330 can include a display, a projector, a video screen, a speaker, or any combination thereof.

The first control unit 312 can operate the first user interface 318 to display information generated by the communication system 100. The first control unit 312 can also execute the first software 326 for the other functions of the communication system 100. The first control unit 312 can further execute the first software 326 for interaction with the communication path 104 via the first communication unit 316.

The wired device 106 can be optimized for implementing an embodiment of the present invention in a multiple device embodiment with the communication device 102. The wired device 106 can provide the additional or higher performance processing power compared to the communication device 102. The wired device 106 can include a second control unit 334, a second communication unit 336, and a second user interface 338.

The second user interface 338 allows a user (not shown) to interface and interact with the wired device 106. The second user interface 338 can include an input device and an output device. Examples of the input device of the second user interface 338 can include a keypad, a touchpad, soft-keys, a keyboard, a microphone, or any combination thereof to provide data and communication inputs. Examples of the output device of the second user interface 338 can include a second display interface 340. The second display interface 340 can include a display, a projector, a video screen, a speaker, or any combination thereof.

The second control unit 334 can execute a second software 342 to provide the intelligence of the wired device 106 of the communication system 100. The second software 342 can operate in conjunction with the first software 326. The second control unit 334 can provide additional performance compared to the first control unit 312.

The second control unit 334 can operate the second user interface 338 to display information. The second control unit 334 can also execute the second software 342 for the other functions of the communication system 100, including operating the second communication unit 336 to communicate with the communication device 102 over the communication path 104.

The second control unit 334 can be implemented in a number of different manners. For example, the second control unit 334 can be a processor, an embedded processor, a microprocessor, hardware control logic, a hardware finite state machine (FSM), a digital signal processor (DSP), or a combination thereof.

The second control unit 334 can include a second controller interface 344. The second controller interface 344 can be used for communication between the second control unit 334 and other functional units in the wired device 106. The second controller interface 344 can also be used for communication that is external to the wired device 106.

The second controller interface 344 can receive information from the other functional units or from external sources, or can transmit information to the other functional units or to external destinations. The external sources and the external destinations refer to sources and destinations external to the wired device 106.

The second controller interface 344 can be implemented in different ways and can include different implementations depending on which functional units or external units are being interfaced with the second controller interface 344. For example, the second controller interface 344 can be implemented with a pressure sensor, an inertial sensor, a microelectromechanical system (MEMS), optical circuitry, waveguides, wireless circuitry, wireline circuitry, or a combination thereof.

A second storage unit 346 can store the second software 342. The second storage unit 346 can also store the such as data representing incoming images, data representing previously presented image, sound files, or a combination thereof. The second storage unit 346 can be sized to provide the additional storage capacity to supplement the first storage unit 314.

For illustrative purposes, the second storage unit 346 is shown as a single element, although it is understood that the second storage unit 346 can be a distribution of storage elements. Also for illustrative purposes, the communication system 100 is shown with the second storage unit 346 as a single hierarchy storage system, although it is understood that the communication system 100 can have the second storage unit 346 in a different configuration. For example, the second storage unit 346 can be formed with different storage technologies forming a memory hierarchal system including different levels of caching, main memory, rotating media, or off-line storage.

The second storage unit 346 can be a volatile memory, a nonvolatile memory, an internal memory, an external memory, or a combination thereof. For example, the second storage unit 346 can be a nonvolatile storage such as non-volatile random access memory (NVRAM), Flash memory, disk storage, or a volatile storage such as static random access memory (SRAM).

The second storage unit 346 can include a second storage interface 348. The second storage interface 348 can be used for communication between other functional units in the wired device 106. The second storage interface 348 can also be used for communication that is external to the wired device 106.

The second storage interface 348 can receive information from the other functional units or from external sources, or can transmit information to the other functional units or to external destinations. The external sources and the external destinations refer to sources and destinations external to the wired device 106.

The second storage interface 348 can include different implementations depending on which functional units or external units are being interfaced with the second storage unit 346. The second storage interface 348 can be implemented with technologies and techniques similar to the implementation of the second controller interface 344.

The second communication unit 336 can enable external communication to and from the wired device 106. For example, the second communication unit 336 can permit the wired device 106 to communicate with the communication device 102 over the communication path 104.

The second communication unit 336 can also function as a communication hub allowing the wired device 106 to function as part of the communication path 104 and not limited to be an end point or terminal unit to the communication path 104. The second communication unit 336 can include active and passive components, such as microelectronics or an antenna, for interaction with the communication path 104.

The second communication unit 336 can include a second communication interface 350. The second communication interface 350 can be used for communication between the second communication unit 336 and other functional units in the wired device 106. The second communication interface 350 can receive information from the other functional units or can transmit information to the other functional units.

The second communication interface 350 can include different implementations depending on which functional units are being interfaced with the second communication unit 336. The second communication interface 350 can be implemented with technologies and techniques similar to the implementation of the second controller interface 344.

The first communication unit 316 can couple with the communication path 104 to send information to the wired device 106 in the first device transmission 308. The wired device 106 can receive information in the second communication unit 336 from the first device transmission 308 of the communication path 104.

The second communication unit 336 can couple with the communication path 104 to send information to the communication device 102 in the second device transmission 310. The communication device 102 can receive information in the first communication unit 316 from the second device transmission 310 of the communication path 104. The communication system 100 can be executed by the first control unit 312, the second control unit 334, or a combination thereof. For illustrative purposes, the wired device 106 is shown with the partition having the second user interface 338, the second storage unit 346, the second control unit 334, and the second communication unit 336, although it is understood that the wired device 106 can have a different partition. For example, the second software 342 can be partitioned differently such that some or all of its function can be in the second control unit 334 and the second communication unit 336. Also, the wired device 106 can include other functional units not shown in FIG. 3 for clarity.

The functional units in the communication device 102 can work individually and independently of the other functional units. The communication device 102 can work individually and independently from the wired device 106 and the communication path 104.

The functional units in the wired device 106 can work individually and independently of the other functional units. The wired device 106 can work individually and independently from the communication device 102 and the communication path 104.

For illustrative purposes, the communication system 100 is described by operation of the communication device 102 and the wired device 106. It is understood that the communication device 102 and the wired device 106 can operate any of the modules and functions of the communication system 100.

Figure 4:
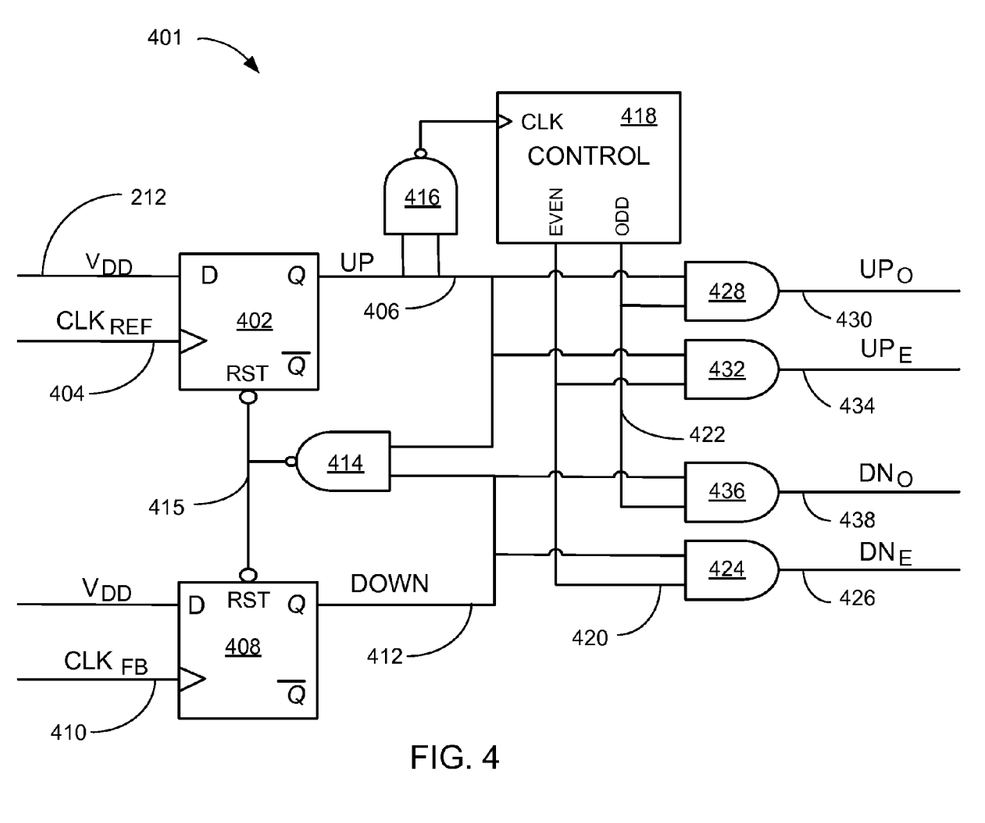
FIG. 4 is a schematic diagram of a phase-frequency detector for the charge pump of FIG. 2.

Referring now to FIG. 4, therein is shown a schematic diagram of a phase-frequency detector 401 for the charge pump of FIG. 2. The schematic diagram of a phase-frequency detector 401 depicts a reference detector 402, such as a "D" flip-flop, for detecting the arrival of an incoming clock reference 404. A data input of the reference detector 402 can be coupled to the positive supply 212. On the positive transition of the incoming clock reference 404, a charge-up mode 406 is activated.

A feedback detector 408, such as a "D" flip-flop, for detecting the arrival of a feedback clock 410. The feedback clock 410 is a clock divided from the frequency synthesis phase-lock loop 328 of FIG. 3. The data input of the feedback detector 408 can be coupled to the positive supply 212. On the positive transition of the feedback clock 410, a charge-down mode 412 is activated.

A reset gate 414, such as a NAND gate, can generate a reset pulse 415 when both the charge-up mode 406 and the charge-down mode 412 are both set on. The duration of the reset pulse 415 is determined by the reset time of the reference detector 402 or the feedback detector 408, and the propagation delay of the reset gate 414. The reset pulse 415 can reset both the reference detector 402 and the feedback detector 408 as soon as the reset gate 414 recognizes that both the charge-up mode 406 and the charge-down mode 412 are set.

A cycle gate 416, such as a NAND gate, can generate a clock for switching a cycle control circuit 418. When the charge-up mode 406 is activated, the clock on the cycle control circuit 418 is negated. When the charge-up mode 406 is reset, by the reset pulse 415, a low to high transition on the clock will cause the cycle control circuit 418 to activate either an even cycle signal 420 or an odd cycle signal 422. On the next subsequent low to high transition of the clock will cause the cycle control circuit 418 to switch to the other of the even cycle signal 420 or the odd cycle signal 422. The cycle control circuit 418 can only switch between the even cycle signal 420 or the odd cycle signal 422 when both the charge-up mode flip-flop 402 and the charge-down mode flip-flop 412 are reset.

A first switch selector 424 can be an AND gate that is qualified by the even cycle signal 420 and the charge-down mode 412. The first switch selector 424 can output a first switch enable 426 that is coupled to and controls the first switch 220 of FIG. 2. A second switch selector 428 can be an AND gate that is qualified by the odd cycle signal 422 and the charge-up mode 406. The second switch selector 428 can output a second switch enable 430 that is coupled to and controls the second switch 222 of FIG. 2. It is understood that the cycle control circuit 418 can only activate one of the even cycle signal 420 or the odd cycle signal 422 at a time and that the transition between the even cycle signal 420 or the odd cycle signal 422 can only occur when the charge-up mode 406 and the charge-down mode 412 are both negated.

A third switch selector 432 can be an AND gate that is qualified by the even cycle signal 420 and the charge-up mode 406. The third switch selector 432 can output a third switch enable 434 that is coupled to and controls the third switch 224 of FIG. 2. A fourth switch selector 436 can be an AND gate that is qualified by the odd cycle signal 422 and the charge-down mode 412. The fourth switch selector 436 can output a fourth switch enable 438 that is coupled to and controls the fourth switch 226 of FIG. 2.

It has been discovered that differentiating the odd cycle signal 422 and even cycle signal 420 of the charge pump 201 of FIG. 1 and activating the first switch enable 426, the second switch enable 430, third switch enable 434, or the fourth switch enable 438 for charging-up and charging-down the amplifier output 228 of FIG. 2 can produce an average of the up current and the down current that are equal. The error associated with a difference between the charge-up function and the charge-down function will be shifted to a high frequency of ½ reference frequency where it will be attenuated by the low-pass filter 230 of FIG. 2. The charge pump 201 can charge-up the amplifier output 228 through the R2 resistor 218 and the third switch 224 on the even cycle signal 420 and through the R1 resistor 216 and the second switch 222 on the odd cycle signal 422. Likewise, the charge pump 201 can charge-down the amplifier output 228 through the R1 resistor 216 and the first switch 220 on the even cycle signal 420 and through the R2 resistor 218 and the fourth switch 226 on the odd cycle signal 422.

It should be recognized that for a short period both the charge-up mode 406 and the charge-down mode 412 can both be asserted. The activation of the first switch enable 426, the second switch enable 430, third switch enable 434, or the fourth switch enable 438 will be determined by the odd cycle signal 422 and even cycle signal 420. In the case of two of the switched being activated simultaneously, the net current flowing into the input 206 will be approximately zero because both of the R1 resistor 216 and the R2 resistor 218 will be activated between the positive supply 212 of FIG. 2 and the negative supply 214 of FIG. 2.

Figure 5:
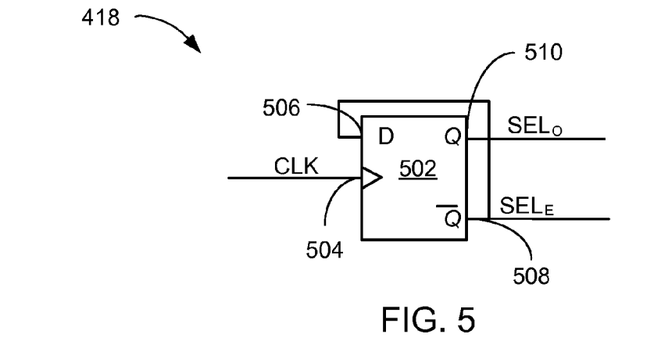
FIG. 5 is a schematic diagram of the cycle control circuit for the charge pump of FIG. 2.

Referring now to FIG. 5, therein is shown a schematic diagram of the cycle control circuit 418 for the charge pump 201 of FIG. 2. The schematic diagram of the cycle control circuit 418 depicts a flip-flop 502 having a clock input 504 and a data input 506.

The flip-flop 502 can also have complimentary outputs including an inverted output 508 and a non-inverted output 510. By coupling the inverted output 508 to the data input 506, each transition, from low to high, of the clock input 504 will cause the inverted output 508 and the non-inverted output 510 to exchange states. By way of an example, if the non-inverted output 510 is asserted (set to a high level) and the inverted output 508 is negated (set to a low level), after the transition of the clock input 504 the non-inverted output 510 will be negated and the inverted output 508 will be asserted.

The non-inverted output 510 can represent the odd cycle signal 422 of FIG. 4 and the inverted output 508 can represent the even cycle signal 420 of FIG. 4. Since the clock input 504 can be coupled to the output of the cycle gate 416 of FIG. 4, the clock input 504 will transition from low to high every time the charge-up mode 406 of FIG. 4 is reset. The resultant transitions of the inverted output 508 and the non-inverted output 510 will occur with each occurrence of resetting the charge-up mode 406 and are used to determine the even cycle signal 420 and the odd cycle signal 422.

Figure 6:
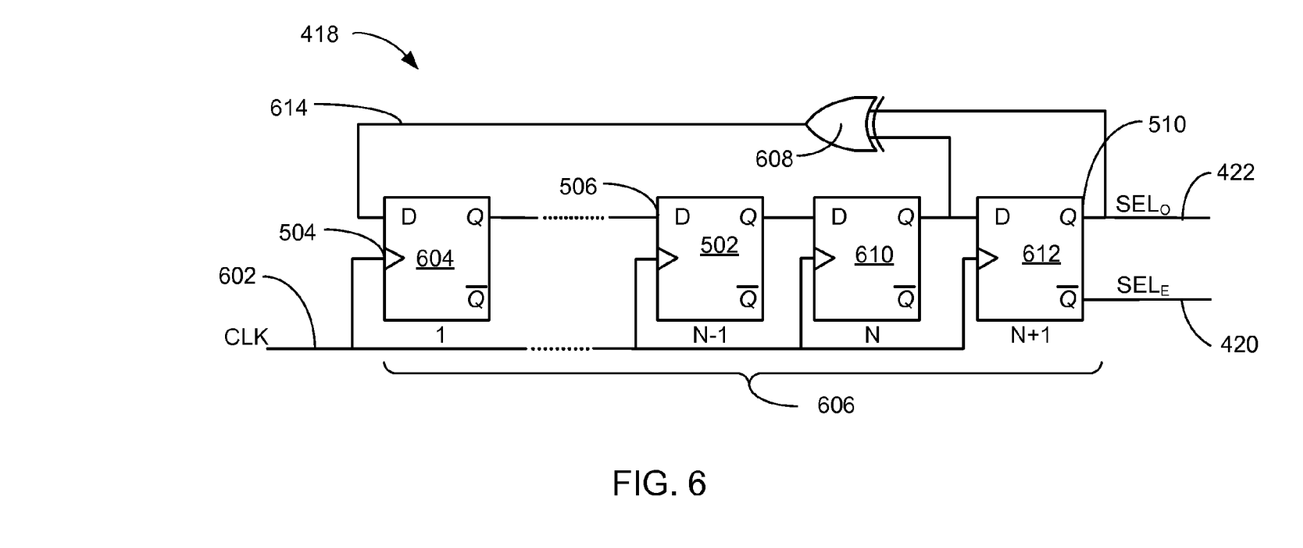
FIG. 6 is a schematic diagram of an alternate embodiment of the cycle control circuit for the charge pump of FIG. 2.

Referring now to FIG. 6, therein is shown a schematic diagram of an alternate embodiment of the cycle control circuit 418 for the charge pump 201 of FIG. 2. The schematic diagram of the alternate embodiment of the cycle control circuit 418 depicts a series of the flip-flop 502 having a clock signal 602 coupled to all of the clock input 504 of the series.

A first flip-flop 604 can have the non-inverted output 510 coupled to the data input 506 of the next subsequent instance of the flip-flop 502 in the series. The series can include N+1 instances of the flip-flop 502 configured as a linear feedback shift register (LFSR) 606. An exclusive-OR gate 608 can be coupled to the non-inverted output 510 of the $N^{th}$ stage flip-flop 610 and the non-inverted output 510 of the $N+1^{th}$ stage flip-flop 612 in order to generate a pseudo-random input 614.

It has been discovered that the LFSR 606 can provide a pseudo-random switching of the even cycle 420 and the odd cycle signal 422. The pseudo-random switching of the R1 resistor 216 and the R2 resistor 218 can spread any noise, from a mismatch between the values of the R1 resistor 216 and the R2 resistor 218, can spread the noise. The spreading of the noise significantly reduces the impact of the mismatch of the R1 resistor 216 and the R2 resistor 218, without producing spur component at ½ reference frequency, but the removal of folded noise when the cycle control circuit 418 of FIG. 6 is employed is inferior to that of the cycle control circuit 418 in FIG. 5.

It has been discovered that the communication system 100 provides an elimination of the noise folding issue in the charge pump 201 of FIG. 2 of the phase locked loop of the communication device 102. The commutation of the R1 resistor 216 and the R2 resistor 218 by using the first switch 220, the second switch 222, the third switch 224, and the fourth switch 226 based on the even cycle signal 420 and the odd cycle signal 422 can eliminate the effects of a mismatch in the values of the R1 resistor 216 and the R2 resistor 218.

Figure 7:
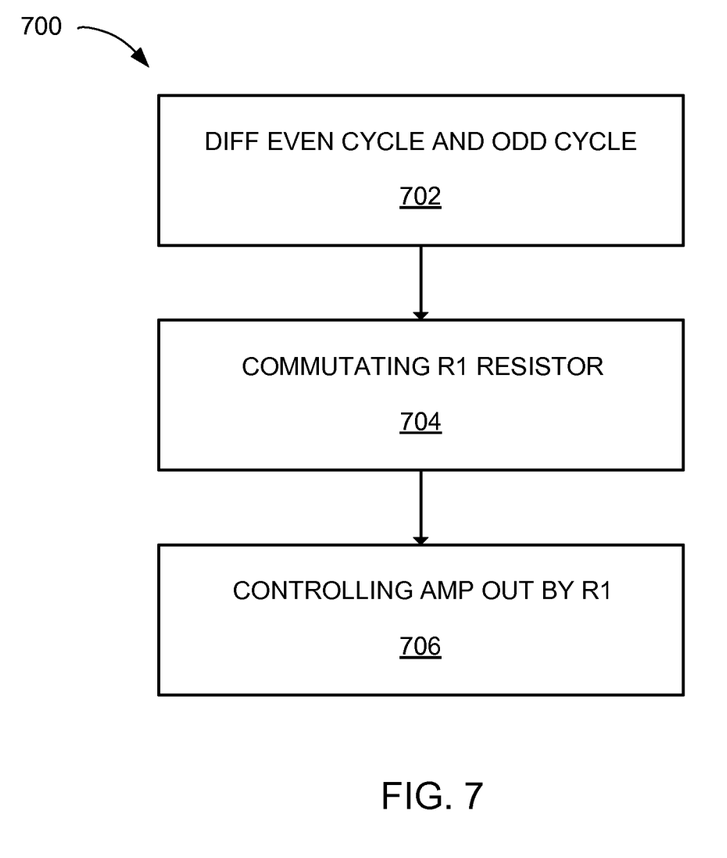
FIG. 7 is a flow chart of a method of operation of a communication system in an embodiment of the present invention.

Referring now to FIG. 7, therein is shown a flow chart of a method 700 of operation of a communication system 100 in an embodiment of the present invention. The method 700 includes: synthesizing an incoming clock reference by differentiating an even cycle and an odd cycle in a block 702; commutating an R1/R2 resistors based on the even cycle and the odd cycle in a block 704; and controlling an amplifier output by the R1/R2 resistors for matching the incoming clock reference in a block 706.

It has been discovered that by differentiating the odd cycle and even cycle of the charge pump and activating the first switch enable, the second switch enable, third switch enable, or the fourth switch enable for charging-up and charging-down the amplifier output can produce an average of the up current and the down current that are equal. The error associated with a difference between the charge-up function and the charge-down function can be shifted to a high frequency, where it can be attenuated by the low-pass filter, while component near DC that gives rise to charge pump non-linearity is eliminated because of the averaging through both the R1 resistor and the R2 resistor. The charge pump can charge-up the amplifier output through the R2 resistor and the third switch on the even cycle and through the R1 resistor and the second switch on the odd cycle. Likewise, the charge pump can charge-down the amplifier output through the R1 resistor and the first switch on the even cycle and through the R2 resistor and the fourth switch on the odd cycle.

The resulting method, process, apparatus, device, product, and/or system is straightforward, cost-effective, uncomplicated, highly versatile, accurate, sensitive, and effective, and can be implemented by adapting known components for ready, efficient, and economical manufacturing, application, and utilization. Another important aspect of an embodiment of the present invention is that it valuably supports and services the historical trend of reducing costs, simplifying systems, and increasing performance.

These and other valuable aspects of an embodiment of the present invention consequently further the state of the technology to at least the next level.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters set forth herein or shown in the accompanying drawings are to be interpreted in an illustrative and non-limiting sense.

What is claimed is:

1. A communication system comprising:
 a cycle control circuit configured to be clocked by an incoming clock reference for differentiating an even cycle signal and an odd cycle signal;
 an R1 resistor configured to be commutated based on the even cycle signal and the odd cycle signal from the cycle control circuit; and
 an amplifier output, controlled by the R1 resistor, configured to match the incoming clock reference.

2. The system as claimed in claim 1 further comprising a reference detector, coupled to the incoming clock reference, configured to generate a charge-up mode.

3. The system as claimed in claim 1 further comprising a feedback detector coupled to a reset gate configured to clock the cycle control circuit by a charge-up mode reset by the reset gate.

4. The system as claimed in claim 1 further comprising a first switch activated on the even cycle or a second switch activated on the odd cycle configured to commutate the R1 resistor.

5. The system as claimed in claim 1 further comprising a low-pass filter, coupled to the amplifier output, configured to block a mismatch between the R1 resistor and an R2 resistor.

6. The system as claimed in claim 1 further comprising:
 an R2 resistor configured to commutate based on the even cycle signal and the odd cycle signal from the cycle control circuit; and
 a feedback detector, coupled to a feedback clock, configured to set a count-down mode based on the amplifier output for matching the incoming clock reference.

7. The system as claimed in claim 6 further comprising:
 a reference detector, coupled to the incoming clock reference, configured to generate a charge-up mode; and
 a first switch selector, coupled to the feedback detector, configured to provide a first switch enable based on a charge-down mode from the feedback detector.

8. The system as claimed in claim 6 wherein the feedback detector coupled to a reset gate configured to clock the cycle control circuit by a charge-up mode reset by the reset gate includes a second switch selector, coupled to the charge-up mode and the odd cycle signal, configured to commutate the R1 resistor.

9. The system as claimed in claim 6 further comprising a first switch activated on the even cycle signal or a second switch activated on the odd cycle signal configured to commute the R1 resistor includes:
 a first switch selector coupled to the even cycle signal and a charge-down mode from the feedback detector; and
 a second switch selector coupled to a charge-up mode, from a reference detector, and the odd cycle signal.

10. The system as claimed in claim 6 further comprising a low-pass filter, coupled to the amplifier output, configured to block a mismatch between the R1 resistor and an R2 resistor includes a linear feedback shift register configured to control the even cycle signal and the odd cycle signal.

11. A method of operation of a communication system comprising:
 synthesizing an incoming clock reference by differentiating an even cycle signal and an odd cycle signal;
 commutating an R1 resistor based on the even cycle signal and the odd cycle signal; and
 controlling an amplifier output by the R1 resistor for matching the incoming clock reference.

12. The method as claimed in claim 11 further comprising generating a charge-up mode by detecting the incoming clock reference.

13. The method as claimed in claim 11 wherein differentiating the even cycle signal and the odd cycle signal includes clocking a cycle control circuit by resetting a charge-up mode.

14. The method as claimed in claim 11 wherein commutating the R1 resistor includes activating a first switch on the even cycle signal or a second switch on the odd cycle signal.

15. The method as claimed in claim 11 further comprising monitoring, by a low-pass filter, the amplifier output for blocking a mismatch between the R1 resistor and an R2 resistor.

16. A communication system comprising:
 an amplifier having a detected input;
 an R1 resistor coupled to the detected input;
 a cycle control circuit configured to generate an even cycle signal or an odd cycle signal;
 a first switch, coupled to the R1 resistor, configured to couple a negative supply through the R1 resistor to the amplifier;
 a first switch selector, coupled to the first switch, configured to enable the first switch for the even cycle signal;

a second switch, coupled to the R1 resistor, configured to couple a positive supply through the R1 resistor to the amplifier; and a second switch selector, coupled to the second switch configured to enable e second switch for the odd cycle.

17. The system as claimed in claim 16 further comprising:

an R2 resistor coupled to the detected input and the R1 resistor;

a third switch, coupled to the R2 resistor, configured to couple the positive supply through the R2 resistor to the amplifier;

a third switch selector, coupled to the third switch, configured to control the third switch for the even cycle;

a fourth switch, coupled to the R2 resistor, configured to couple the negative supply through the R2 resistor to the amplifier; and a fourth switch selector, coupled to the fourth switch, configured to control the fourth switch for the even cycle.

18. The system as claimed in claim 16 further comprising:

an amplifier output of the amplifier;

a low-pass filter coupled between the amplifier output and the detected input configured to attenuate a mismatch error.

19. The system as claimed in claim 16 further comprising a feedback detector, coupled to a feedback clock, configured to clock the cycle control circuit including the R1 resistor commutated by the first switch and the second switch.

* * * * *